(12) United States Patent
Pekarik et al.

(10) Patent No.: US 11,264,499 B2
(45) Date of Patent: Mar. 1, 2022

(54) TRANSISTOR DEVICES WITH SOURCE/DRAIN REGIONS COMPRISING AN INTERFACE LAYER THAT COMPRISES A NON-SEMICONDUCTOR MATERIAL

(71) Applicant: GLOBALFOUNDRIES U.S.Inc., Santa Clara, CA (US)

(72) Inventors: John J. Pekarik, Underhill, VT (US); Steven M. Shank, Jericho, VT (US); Anthony K. Stamper, Burlington, VT (US); Vibhor Jain, Essex Junction, VT (US); John Ellis-Monaghan, Grand Isle, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/571,798

(22) Filed: Sep. 16, 2019

(65) Prior Publication Data
US 2021/0083111 A1  Mar. 18, 2021

(51) Int. Cl.
*H01L 29/02* (2006.01)
*H01L 29/78* (2006.01)
(Continued)

(52) U.S. Cl.
CPC .... *H01L 29/7843* (2013.01); *H01L 21/02488* (2013.01); *H01L 29/0653* (2013.01);
(Continued)

(58) Field of Classification Search
CPC ..... H01L 21/823814; H01L 21/823821; H01L 21/02532; H01L 21/823807; H01L 27/092; H01L 21/30604; H01L 21/823418; H01L 21/0262; H01L 21/26506; H01L 21/26586; H01L 21/324; H01L 27/1211; H01L 21/3065; H01L 21/76224; H01L 21/823842; H01L 21/823871; H01L 21/845; H01L 21/02164; H01L 29/7843; H01L 21/02488; H01L 29/0653;
(Continued)

(56) References Cited

U.S. PATENT DOCUMENTS

| 4,695,857 A | 9/1987 | Baba et al. |
| 5,093,275 A * | 3/1992 | Tasch, Jr ............. H01L 29/0847 438/300 |

(Continued)

OTHER PUBLICATIONS

Simoen et al., "Deep levels in silicon-oxygen superlattices," Semiconductor Science and Technology, 31:1-8, 2016.

*Primary Examiner* — Samuel Park
(74) *Attorney, Agent, or Firm* — Francois Pagette; Hoffman Warnick LLC

(57) ABSTRACT

One illustrative transistor device disclosed herein includes a gate structure positioned above a semiconductor substrate and a source region and a drain region, each of which comprise an epi cavity with a bottom surface and a side surface. The transistor further includes an interface layer positioned on at least one of the side surface and the bottom surface of the epi cavity in each of the source/drain regions, wherein the interface layer comprises a non-semiconductor material and an epi semiconductor material positioned on at least an upper surface of the interface layer in the epi cavity in each of the source region and the drain region.

16 Claims, 8 Drawing Sheets

(51) Int. Cl.
  *H01L 29/08*  (2006.01)
  *H01L 21/02*  (2006.01)
  *H01L 29/66*  (2006.01)
  *H01L 29/06*  (2006.01)

(52) U.S. Cl.
  CPC ...... *H01L 29/0847* (2013.01); *H01L 29/6656* (2013.01); *H01L 29/66795* (2013.01); *H01L 29/785* (2013.01); H01L 21/0228 (2013.01); H01L 21/02164 (2013.01)

(58) Field of Classification Search
  CPC ............ H01L 29/0847; H01L 29/6656; H01L 29/66795; H01L 29/785; H01L 21/0228; H01L 29/0895; H01L 29/6653; H01L 29/66643; H01L 29/78; H01L 29/7848; H01L 29/66628
  See application file for complete search history.

(56) References Cited

U.S. PATENT DOCUMENTS

| | | |
|---|---|---|
| 5,824,586 A | 10/1998 | Wolleson et al. |
| 6,621,114 B1 * | 9/2003 | Kim .................. H01L 21/28194 257/310 |
| 7,009,258 B2 | 3/2006 | Park et al. |
| 7,202,494 B2 | 4/2007 | Blachard et al. |
| 7,279,701 B2 | 10/2007 | Kreps |
| 7,433,729 B2 | 10/2008 | Setlak et al. |
| 7,446,002 B2 | 11/2008 | Mears et al. |
| 7,517,702 B2 | 4/2009 | Halilov et al. |
| 7,531,828 B2 | 5/2009 | Mears et al. |
| 7,531,829 B2 | 5/2009 | Blanchard |
| 7,535,041 B2 | 5/2009 | Blancard |
| 7,598,515 B2 | 10/2009 | Mears et al. |
| 7,652,332 B2 | 1/2010 | Cartier et al. |
| 7,781,827 B2 | 8/2010 | Rao |
| 8,338,260 B2 | 12/2012 | Cheng et al. |
| 9,899,479 B2 | 2/2018 | Mears et al. |
| 2004/0266116 A1 | 12/2004 | Mears et al. |
| 2006/0076627 A1 * | 4/2006 | Chen ...................... H01L 21/324 257/369 |
| 2006/0220118 A1 | 10/2006 | Stephenson et al. |
| 2006/0273299 A1 | 12/2006 | Stephenson et al. |
| 2007/0015344 A1 | 1/2007 | Mears et al. |
| 2007/0018236 A1 * | 1/2007 | Tsuchiaki .......... H01L 29/78687 257/324 |
| 2008/0048217 A1 * | 2/2008 | Kim .................... H01L 29/7848 257/288 |
| 2008/0217686 A1 | 9/2008 | Majumdar et al. |
| 2009/0227083 A1 * | 9/2009 | Holz ...................... H01L 21/31 438/294 |
| 2013/0032859 A1 * | 2/2013 | Pei ...................... H01L 29/6653 257/192 |
| 2014/0346600 A1 * | 11/2014 | Cheng ................. H01L 29/7849 257/347 |
| 2015/0255294 A1 * | 9/2015 | Leobandung ..... H01L 29/42368 257/410 |
| 2017/0077223 A1 * | 3/2017 | Song ........................ H01L 29/24 |
| 2018/0040743 A1 | 2/2018 | Mears et al. |

* cited by examiner

TRANSISTOR DEVICES WITH SOURCE/DRAIN REGIONS COMPRISING AN INTERFACE LAYER THAT COMPRISES A NON-SEMICONDUCTOR MATERIAL

BACKGROUND

Field of the Invention

The present disclosure generally relates to various methods of forming a transistor device comprising source/drain regions that comprise an interface layer that comprises a non-semiconductor material and various embodiments of transistor devices that comprise such an interface layer.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either N-type (NFET) or P-type (PFET) devices, wherein the "N" and "P" designation is based upon the type of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region of the transistor.

A conventional FET is a planar device. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. In contrast, a FinFET device is a three-dimensional device that comprises at least one fin that is oriented perpendicular to the base semiconductor substrate, i.e., the fin has a height, a length (in the gate length direction of the device) and a width (in the gate width direction of the device). A FinFET device also includes a gate structure that covers a portion of the axial length of the fin. The portions of the fin covered by the gate structure is the channel region of the FinFET device, while the portions of the fin positioned laterally outside of the gate structure are part of the source/drain regions of the device.

Device designers are under constant pressure to increase the performance of transistor devices as well as increase packing densities in IC products. One area where device designers have focused greater effort is on manufacturing transistors with a limited amount of dopant materials in the channel region of the transistor device. These types of devices (with limited amounts of dopant material in the channel region of the transistor device) can exhibit improved electrical performance characteristics relative to similar transistors with significant amounts of dopant atoms within the channel region.

The present disclosure is generally directed to various methods of forming a transistor device comprising source/drain regions that include an interface layer that comprises a non-semiconductor material and various embodiments of transistor devices that comprise such an interface layer.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a transistor device comprising source/drain regions that include an interface layer that comprises a non-semiconductor material and various embodiments of a transistor device that comprises such an interface layer. One illustrative transistor device disclosed herein includes a gate structure positioned above a semiconductor substrate and a source region and a drain region, each of which comprise an epi cavity with a bottom surface and a side surface. The transistor further includes an interface layer positioned on at least one of the side surface and the bottom surface of the epi cavity in each of the source/drain regions, wherein the interface layer comprises a non-semiconductor material and an epi semiconductor material positioned on at least an upper surface of the interface layer in the epi cavity in each of the source region and the drain region.

Another illustrative transistor device disclosed herein includes a gate structure positioned above a semiconductor substrate, a source region and a drain region. The transistor further includes an interface layer positioned above an upper surface of the substrate in the source/drain regions, wherein the interface layer comprises a non-semiconductor material and an epi semiconductor material positioned and in contact with an upper surface of the interface layer in each of the source region and the drain region Yet another illustrative transistor device disclosed herein includes a gate structure positioned above a semiconductor substrate, a source region and a drain region. Each of the source/drain regions comprises a stepped epi cavity formed in the semiconductor substrate having an upper cavity and a lower cavity. In one embodiment, the upper cavity comprises a first side surface and a first bottom surface, while the lower cavity comprises a second side surface and a second bottom surface, wherein the first bottom surface intersects the second side surface. The transistor further includes an interface layer positioned on at least one of the second side surface and the second bottom surface of the lower epi cavity in each of the source/drain regions, wherein the interface layer comprises a non-semiconductor material and an epi semiconductor material positioned on at least an upper surface of the interface layer and the first side surface and the first bottom surface of the upper epi cavity.

BRIEF DESCRIPTION OF THE DRAWINGS

The disclosure may be understood by reference to the following description taken in conjunction with the accompanying drawings, in which like reference numerals identify like elements, and in which.

Figure 1:
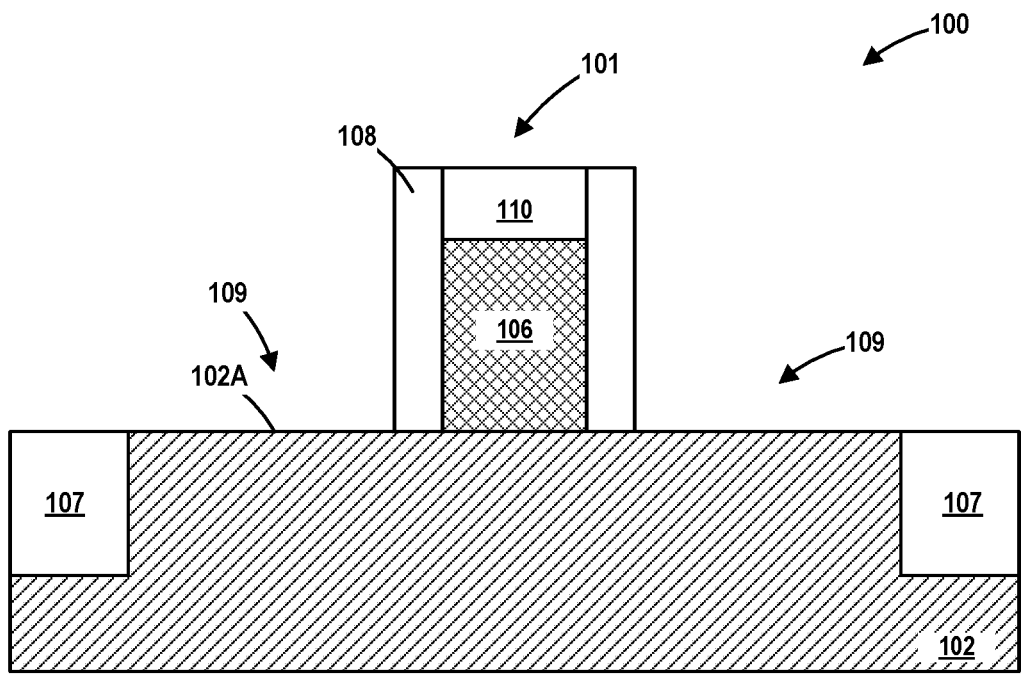
FIGS. 1-16 depict various novel methods of forming a transistor device comprising source/drain regions that include an interface layer that comprises a non-semiconductor material and various embodiments of transistor devices that comprise such an interface layer. It should be noted that the attached drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

Figure 2:
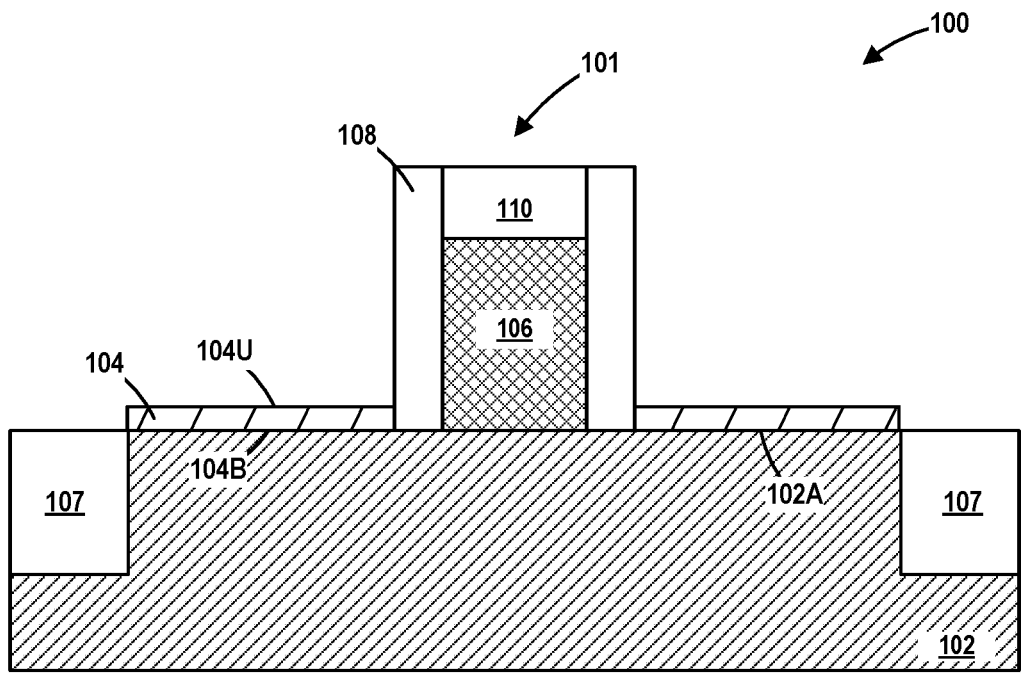
Figure 3:
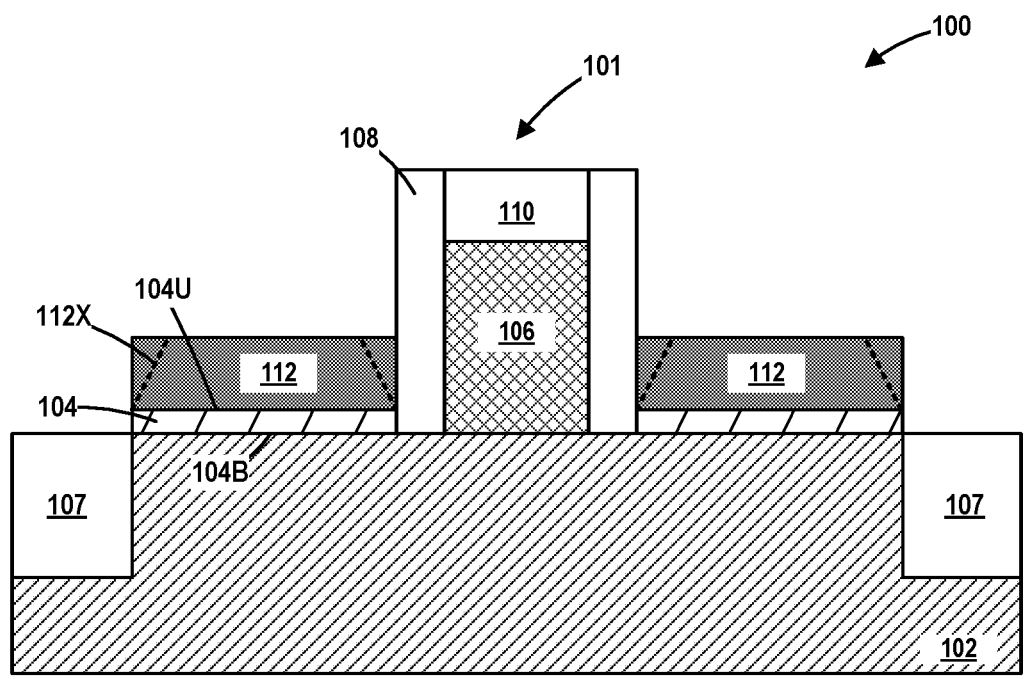

FIGS. 1-3 depict various methods of forming one illustrative embodiment of a transistor device 100 with source/drain regions that comprise at least one interface layer 104. As will be appreciated by those skilled in the art after a complete reading of the present application, the transistor devices 100 disclosed herein may be an N-type or a P-type device and they may be formed on a bulk semiconductor substrate or a semiconductor-on-insulator substrate. Moreover, the transistor devices 100 disclosed herein may come in a variety of different forms, e.g., a planar device, a FinFET device, etc. Additionally, the gate structure of the transistor devices 100 disclosed herein may be manufactured using known gate-first or replacement gate manufacturing techniques. For purposes of disclosure only, the transistor devices 100 described below will be planar devices that are formed above a bulk semiconductor substrate 102 wherein the gate structure of the transistor device 100 is formed by performing known replacement gate manufacturing techniques. However, as noted above, the various inventions disclosed herein should not be considered to be limited to the particular example shown in the attached drawings and described below.

FIG. 1 depicts an IC product after several steps have been taken to form the transistor device 100 above a bulk semiconductor substrate 102 having an upper surface 102A. As noted above, the transistor device 100 may also be formed on a semiconductor-on-insulator (SOI) substrate that includes a base semiconductor layer, a buried insulation layer and an active semiconductor layer positioned above the buried insulation layer, wherein transistor devices are formed in and above the active semiconductor layer. The substrate (irrespective of its form) may be made of silicon or it may be made of semiconductor materials other than silicon. Thus, the terms "substrate" or "semiconductor substrate" should be understood to cover all semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

FIG. 1 depicts the transistor device 100 after several process operations were performed to form a plurality of isolation structures 107 in the substrate 102. The isolation structures 107 may be comprised of a variety of different materials, e.g., silicon dioxide, etc., and they may be formed by performing traditional etching, deposition and planarization processes.

As noted above, in the particular example depicted herein, the gate structure of the transistor device 100 will be formed by performing known replacement gate manufacturing techniques. Accordingly, FIG. 1 depicts a sacrificial gate structure 106, a gate cap 110 and a sidewall spacer 108. Collectively, the sacrificial gate structure 106, gate cap 110 and sidewall spacer 108 define a gate 101. As is common, the sacrificial gate structure 106 typically comprises a layer of sacrificial gate insulation material (not separately shown), e.g., silicon dioxide, and a layer of sacrificial gate electrode material (not separately shown), e.g., amorphous silicon, polysilicon, etc. The gate cap 110 may be comprised of a material such as silicon nitride. The techniques for forming the sacrificial gate structure 106 and the gate cap 110 are well known to those skilled in the art. After formation of the sacrificial gate structure 106 and the gate cap 110, the simplistically depicted sidewall spacer 108 was formed around and adjacent the entire perimeter of the sacrificial gate structure 106. Although only a single sidewall spacer 108 is depicted in the drawings, in practice, more than one sidewall spacer may be formed adjacent the sacrificial gate structure 106. The sidewall spacer 108 may be formed by depositing a conformal layer of spacer material (not shown)

above the substrate 102 and thereafter performing an anisotropic etching process to remove horizontally positioned portions of the layer of spacer material. The spacer 108 may be of any desired thickness (as measured at its base) and it may be comprised of a variety of different materials, e.g., silicon dioxide, a low-k material, silicon nitride, SiCN, SiN, SiCO, and SiOCN, etc. Source/drain regions 109 will be formed in the substrate 102 between the spacer 108 and the isolation structure 107.

FIG. 2 depicts the transistor device 100 after an interface layer 104 was formed above the exposed portions of the upper surface 102A of the substrate 102. The interface layer 104 disclosed herein comprises a non-semiconductor material, such as, for example, silicon dioxide, nitrogen, fluorine, carbon, germanium, argon, carbon-oxygen or other materials known to influence the properties of the exposed surface of the semiconductor material 102 on which the interface layer 104 is formed. In the case where the interface layer 104 comprises silicon dioxide, it may be referred to as an oxide interface layer. In one illustrative embodiment, the interface layer 104 shown in FIG. 2 is formed on and in contact with the upper surface 102A of the semiconductor substrate 102. The interface layer 104 has an upper surface 104U and a bottom surface 104B. In some embodiments, the interface layer 104 may be a sub-monolayer of a non-semiconductor material with a thickness of about 5 Å or less, which is formed at the interface of the substrate 102 and the source/drain region 109. In some embodiments, the interface layer 104 may be formed by performing an epitaxial growth process. In other embodiments, the interface layer 104 may be composed of a super-lattice of non-semiconductor material (e.g., oxygen) formed by methods known in the art such that no further explanation is required herein for a complete understanding of the disclosure. In some applications, the thickness of the super-lattice may not exceed 50 Å. By way of example only, the growth of the interface layer 104 can be performed in an ALD (Atomic Layer Deposition) chamber and in a CVD (Chemical Vapor Deposition) chamber. In the illustrative case where the interface layer 104 comprises silicon dioxide, an atomic layer of oxygen can be deposited on a surface of a semiconductor material, such as the substrate 102, in the ALD tool followed by growth or deposition of additional semiconductor material (such as silicon) in the CVD tool. Both of the tools may be connected in situ using a low pressure (vacuum) transfer chamber. In such an arrangement, the substrate or wafer can be transferred back and forth between the two tools without breaking vacuum so as to result in the formation of an interface layer 104 of good quality. As noted above, the interface layer 104 may be comprised of silicon dioxide, nitrogen, fluorine, carbon, germanium, argon, carbon-oxygen or other materials known to influence the properties of the semiconductor material on which it is formed.

FIG. 3 depicts the transistor device 100 after an epitaxial growth process was performed to form simplistically depicted epi semiconductor material 112 above the upper surface 104U of the interface layer 104 in the source/drain regions of the transistor device 100. In one illustrative embodiment, the epi semiconductor material 112 is formed on and in contact with the upper surface 104U of the interface layer 104. The epi semiconductor material 112 may be comprised of any of a variety of semiconductor materials, e.g., silicon-germanium, silicon, etc., for a PFET transistor device 100, or silicon-carbon, silicon, etc., for an NFET transistor device 100. In the example shown in FIG. 3, the simplistically depicted epi semiconductor material 112 has a generally substantially rectangular shaped cross-sectional configuration when viewed in a cross-section taken through the epi semiconductor material 112 in the gate length direction (i.e., current transport direction) of the transistor device 100. In other applications, the epi semiconductor material 112 may have a substantially trapezoidal shaped cross-sectional configuration, as depicted by the dashed lines 112X. The physical size or amount of epi semiconductor material 112 that is grown may vary depending upon the particular application. The epi semiconductor material 112 may be doped in situ, i.e., dopants may be added during the growth process, or it may initially be formed as substantially un-doped epi semiconductor material which will thereafter be subjected to one or more ion implantation processes to introduce dopant atoms into the epi semiconductor material 112.

Figure 4:
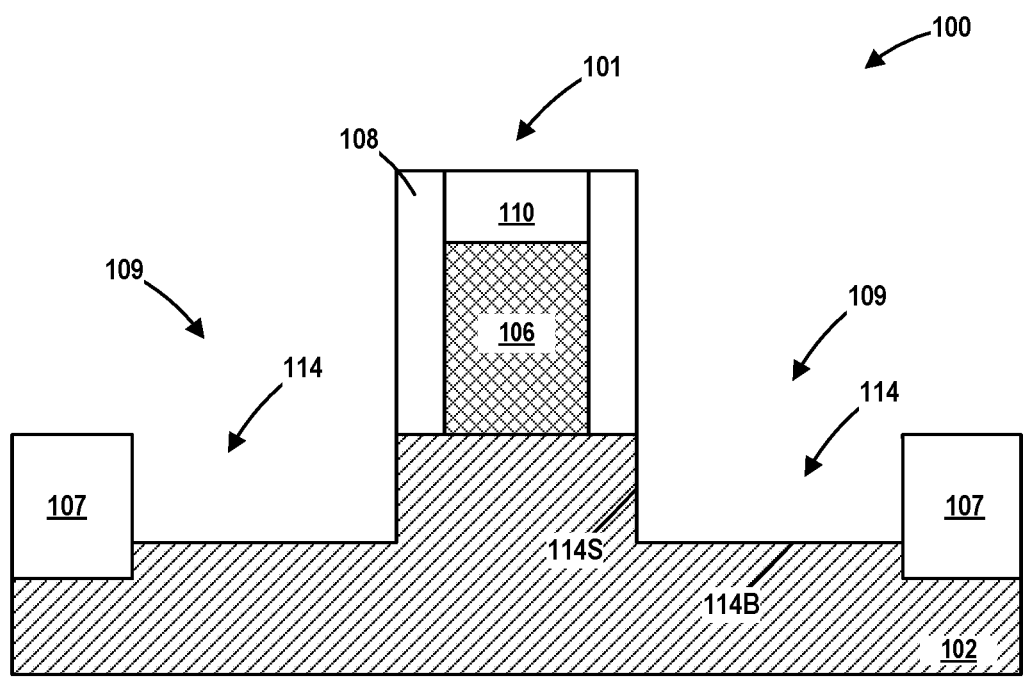
Figure 5:
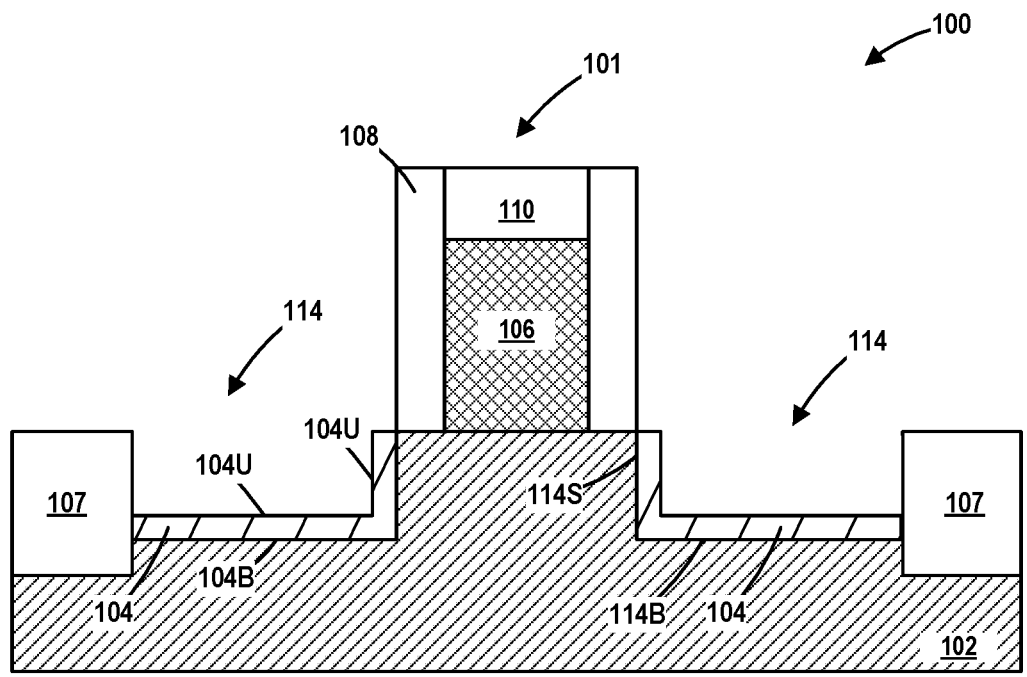
Figure 6:
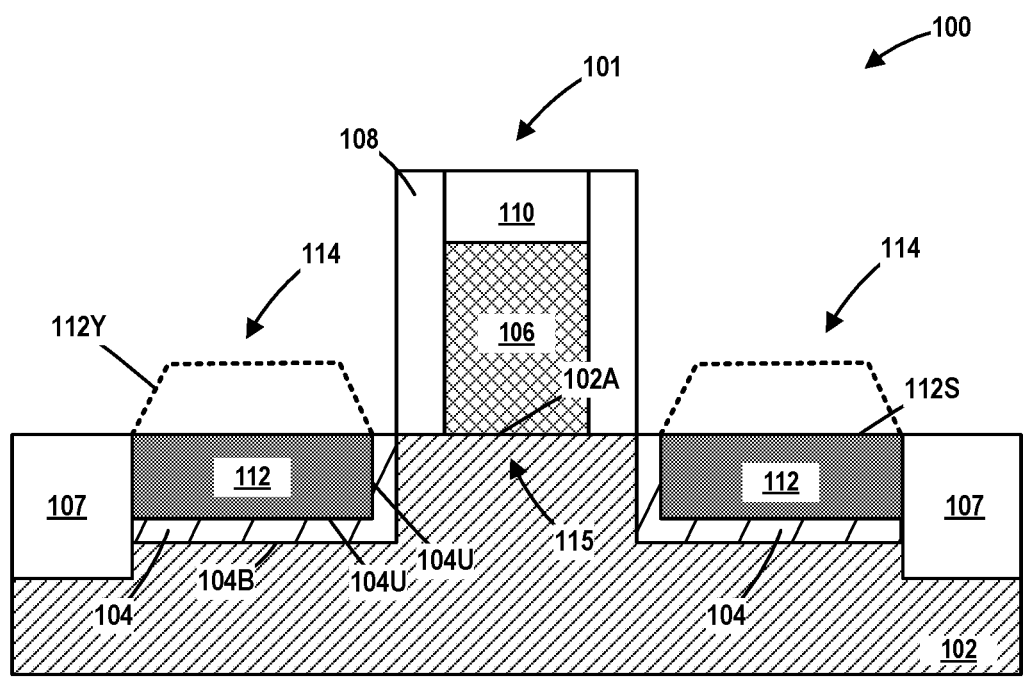

FIGS. 4-6 depict various methods of forming another illustrative embodiment of a transistor device 100 disclosed herein with source/drain regions that comprise an interface layer 104. Starting with the transistor device shown in FIG. 1, FIG. 4 depicts the transistor device 100 after an etching process was formed to form a plurality of epi cavities 114 in the source/drain regions 109 of the transistor device 100. The epi cavities 114 may be formed by performing an anisotropic etching process through a patterned etch mask (not shown) that was formed above the substrate 102. The depth of the epi cavities 114 may vary depending upon the particular application, e.g., 10-100 nm. The epi cavities 114 have a bottom surface 114B and a side surface 114S.

FIG. 5 depicts the transistor device 100 after the above-described interface layer 104 was grown on the exposed bottom surface 114B and the exposed side surface 114S of each of the epi cavities 114.

FIG. 6 depicts the transistor device 100 after the above-described epi semiconductor material 112 was grown on and in contact with the upper surface 104U of the interface layer 104 that is positioned on the side surface 114S and bottom surface 114B of the epi cavities 114. In the example shown in FIG. 6, the epi material 112 is depicted as having an upper surface 112S that is substantially co-planar with the upper surface 102A of the substrate 102. However, in other applications, the upper surface 112S of the epi semiconductor material 112 may be positioned above the level of the upper surface 102A of the substrate 102, and the epi semiconductor material 112 may have a substantially trapezoidal shaped cross-sectional configuration, as depicted by the dashed lines 112Y. Of course, the amount or volume of epi semiconductor material 112 that is formed may vary depending upon the particular application.

As will be appreciated by those skilled in the art after a complete reading of the present application, the formation of the interface layer 104 in the epi cavities 114 may act to limit the diffusion of dopant atoms in the epi semiconductor material 112 into the channel region 115 of the transistor device 100. The inclusion of the interface layer 104 may also be used to impart desired stress profiles on the channel region 115 of the transistor device 100, i.e., a tensile stress for an N-type device or a compressive stress for a P-type device.

Figure 7:
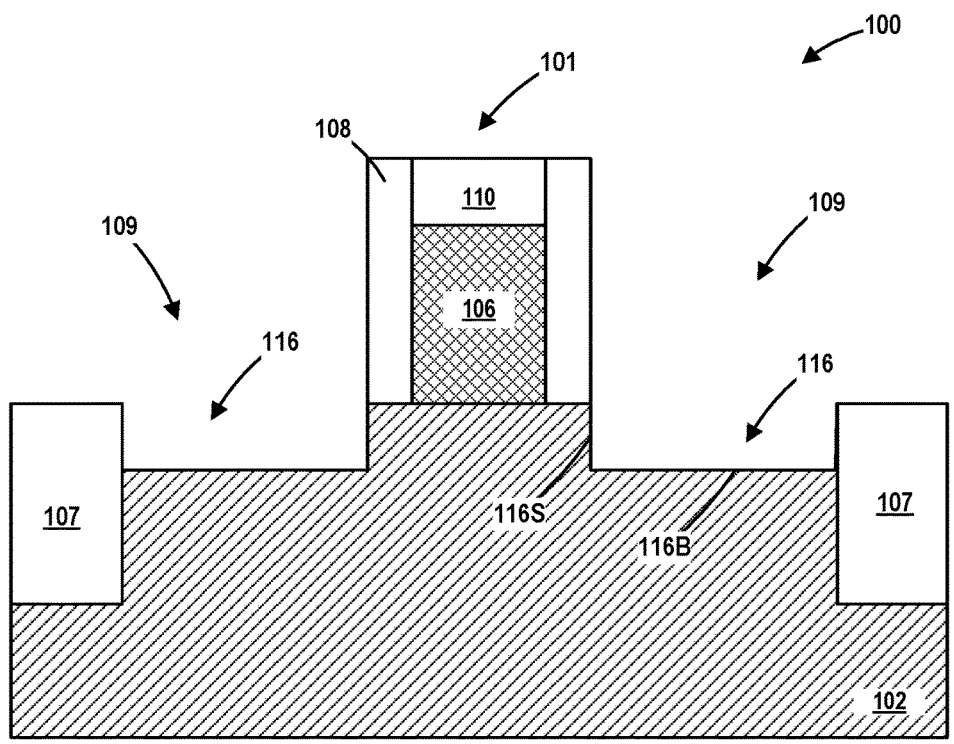

FIGS. 7-12 depict various methods of forming another illustrative embodiment of a transistor device 100 disclosed herein with source/drain regions that comprise an interface layer 104. Starting with the transistor device shown in FIG. 1, FIG. 7 depicts the transistor device 100 after an etching process was formed to form a plurality of initial epi cavities 116 in the source/drain regions 109 of the transistor device 100. The initial epi cavities 116 may be formed by performing an anisotropic etching process through a patterned etch mask (not shown) that was formed above the substrate 102. The depth of the initial epi cavities 116 may vary depending upon the particular application, e.g., 5-50 nm. The initial epi cavities 116 have a bottom surface 116B and a side surface 116S.

Figure 8:
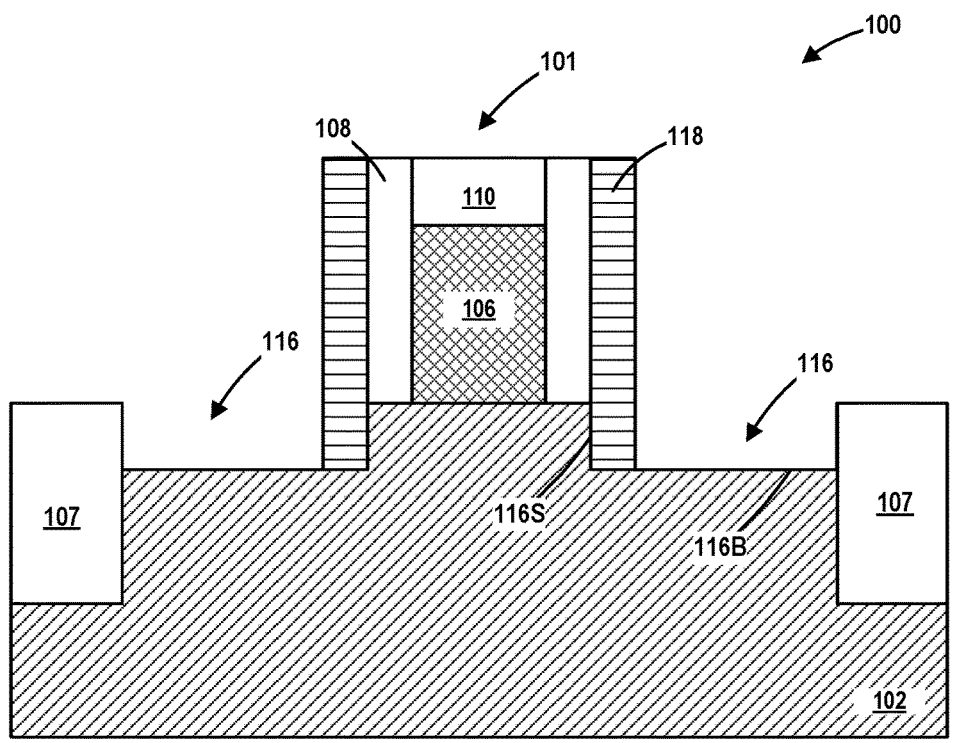

FIG. 8 depicts the transistor device 100 after a sacrificial sidewall spacer 118 was formed adjacent the sidewall spacer 108. As depicted, the lower portion of the sacrificial sidewall spacer 118 contacts the sidewall 116S and a portion of the bottom surface 116B of the initial epi cavities 116. The sacrificial sidewall spacer 118 may be formed by forming a conformal layer of the sacrificial material for the sacrificial sidewall spacer 118 and thereafter performing an anisotropic etching process of the conformal layer of material. The sacrificial sidewall spacer 118 should be made of a material that may be selectively etched relative to the material of the sidewall spacer 108 (and other surrounding materials). The sacrificial sidewall spacer 118 may be of any desired thickness (as measured at its base) and it may be comprised of a variety of different materials, e.g., silicon dioxide, a low-k material, silicon nitride, SiCN, SiN, SiCO, and SiOCN, etc.

Figure 9:
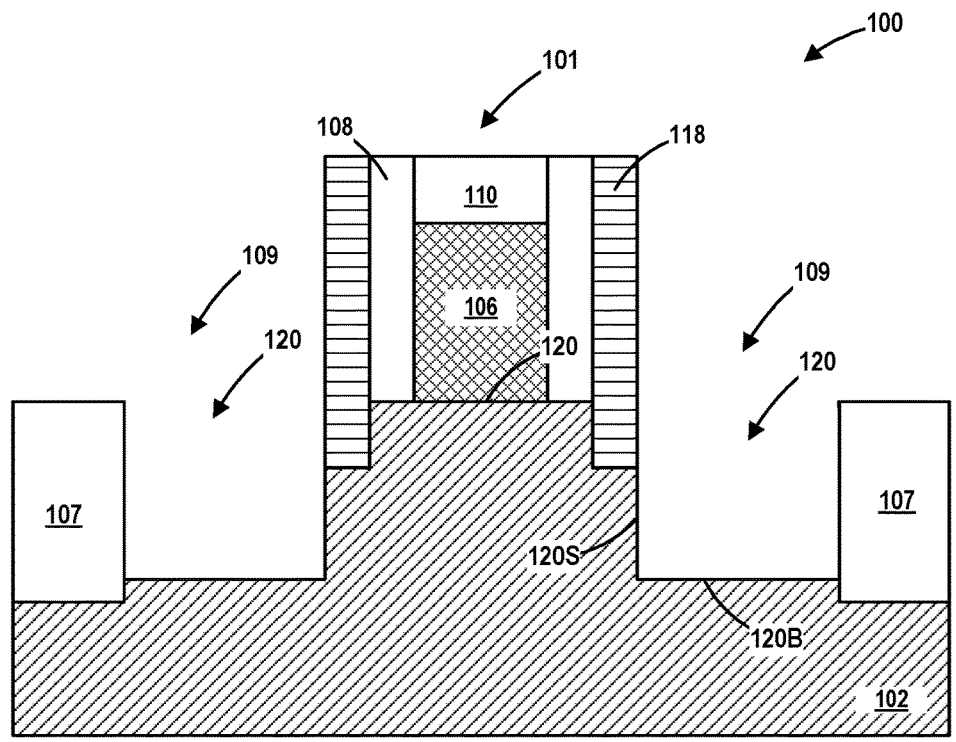

FIG. 9 depicts the transistor device 100 after an etching process was formed to form a plurality of deeper epi cavities 120 in the source/drain regions 109 of the transistor device 100. The deeper epi cavities 120 may be formed by performing an anisotropic etching process through a patterned etch mask (not shown) that was formed above the substrate 102. In effect, the deeper epi cavities 120 extend the depth of a lateral portion of the initial epi cavities 116, i.e., by etching downward through the portion of the bottom surface 116B of the initial epi cavities 116 that is not covered by the sacrificial sidewall spacer 118. The depth of the deeper epi cavities 120 may vary depending upon the particular application. In one illustrative embodiment, the overall depth of the deeper epi cavities 120 relative to the upper surface 102A of the substrate 102 may be about 10-100 nm. The deeper epi cavities 120 have a bottom surface 120B and a side surface 120S.

Figure 10:
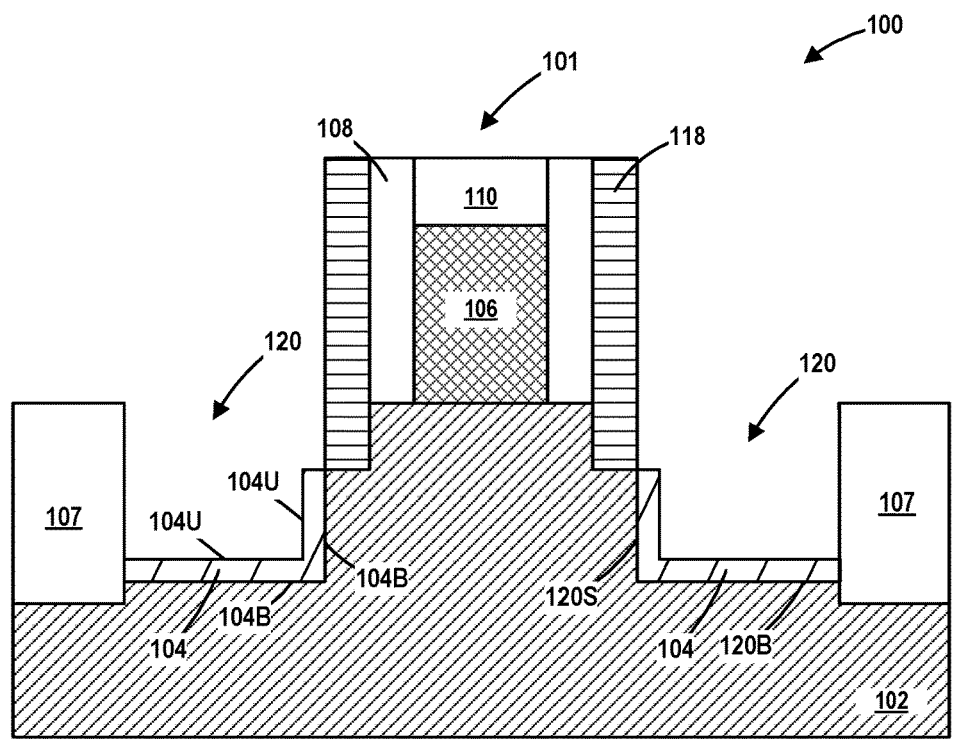

FIG. 10 depicts the transistor device 100 after the above-described interface layer 104 was grown on the bottom surface 120B and side surface 120S of each of the deeper epi cavities 120.

Figure 11:
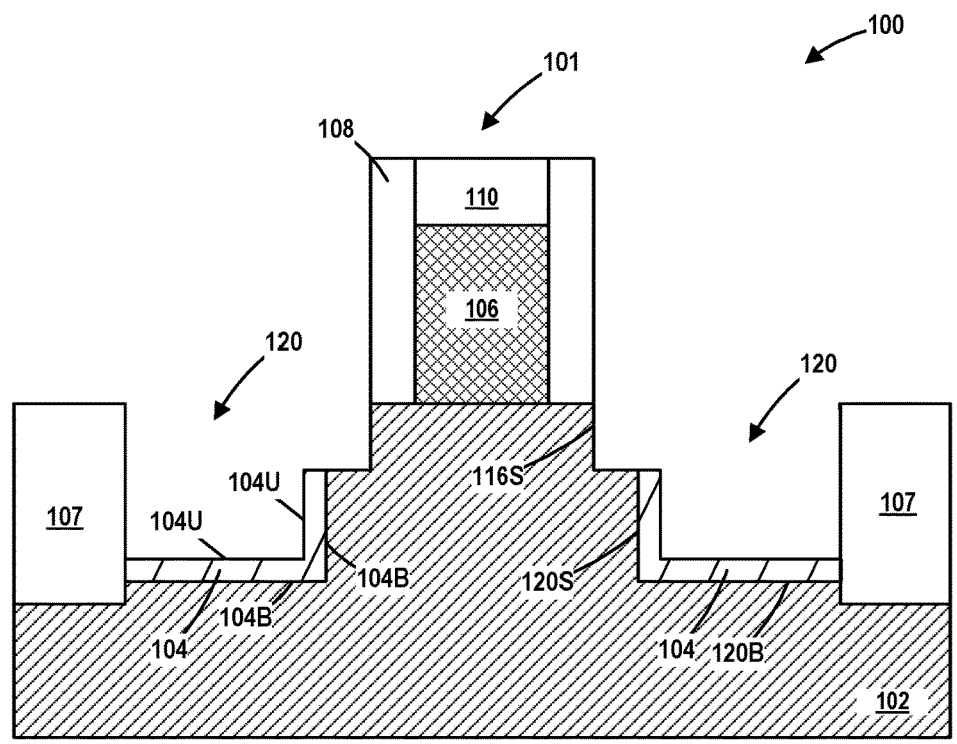

FIG. 11 depicts the transistor device 100 after an etching process was performed to remove the sacrificial sidewall spacer 118 relative to the surrounding materials. This process exposes the side surface 116S of the initial epi cavities 116.

Figure 12:
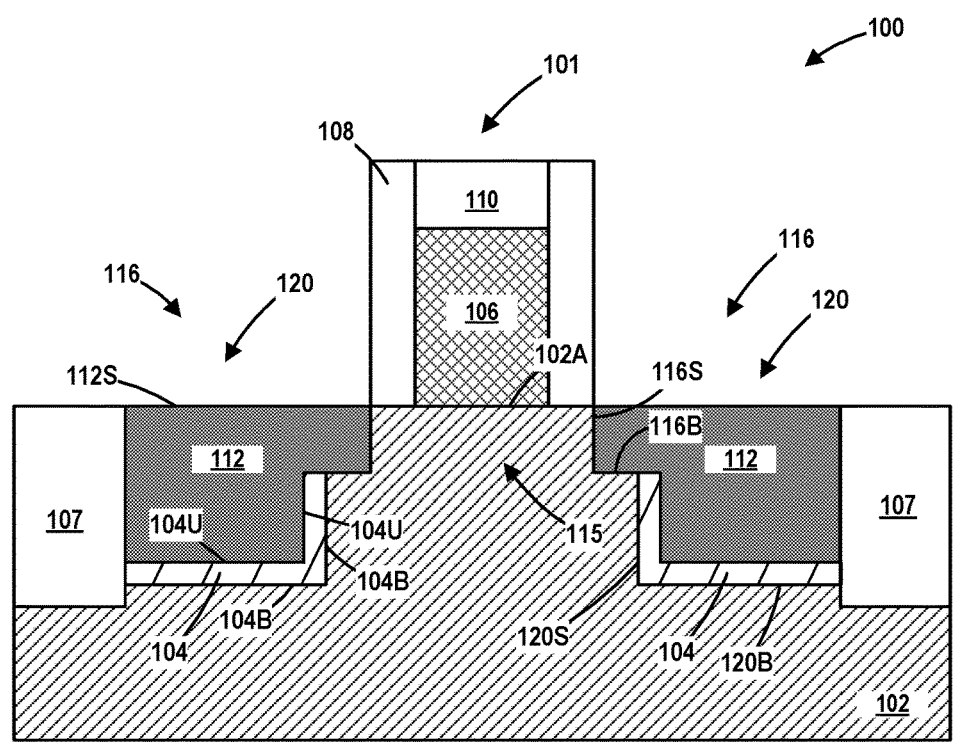

FIG. 12 depicts the transistor device 100 after the above-described epi semiconductor material 112 was grown on the upper surface 104U of the interface layer 104 and on the side surface 116S of the initial epi cavities 116. In the example shown in FIG. 12, the epi material 112 is depicted as having an upper surface 112S that is substantially co-planar with the upper surface 102A of the substrate 102. However, as noted above in connection with FIG. 9, in other applications, the upper surface 112S of the epi semiconductor material 112 may be positioned above the level of the upper surface 102A of the substrate 102, and the epi semiconductor material 112 may have a substantially trapezoidal shaped cross-sectional configuration. Of course, as before, the amount or volume of epi semiconductor material 112 that is formed may vary depending upon the particular application.

As will be appreciated by those skilled in the art after a complete reading of the present application, the embodiment of the transistor device 100 shown in FIG. 12 comprises source and drain regions with a stepped epi cavity formed in the semiconductor substrate. In the depicted example, the stepped epi cavity in each of the source/drain regions comprises an upper (shallower) cavity 116 and a lower (deeper) cavity 120. The upper cavity 116 comprises a first side surface 116S and a first bottom surface 116B, while the lower cavity 120 comprises a second side surface 120S and a second bottom surface 120B. In the depicted example, the first bottom surface 116B intersects the second side surface 120S. Additionally, in the example shown in FIG. 12, the interface layer 104 is positioned on at least one of the second side surface 120S and the second bottom surface 120B of the lower epi cavity 120 in each of the source region and the drain region, and the epi semiconductor material 112 is positioned on at least an upper surface 104U of the interface layer 104 and the epi material 112 contacts the first side surface 116S and the first bottom surface 116B of the upper epi cavity 116. In other embodiments, the epi semiconductor material 112 is positioned on and in contact with an upper surface 104U of the interface layer 104 (that is positioned on and in contact with the entire second side surface 120S and the entire second bottom surface 120B of the lower epi cavity 120) and on and in contact with the entire first side surface 116S and the first bottom surface 116B of the upper epi cavity 116 in each of the source region and the drain region of the transistor device 100.

As will be appreciated by those skilled in the art after a complete reading of the present application, the formation of the interface layer 104 in the deeper epi cavities 120 may act to limit the diffusion of dopant atoms in the epi semiconductor material 112 into the channel region 115 of the transistor device 100, at least at locations below the side surface 116S of the initial epi cavities 116. The inclusion of the interface layer 104 may also be used to impart desired stress profiles on the channel region 115 of the transistor device 100, i.e., a tensile stress for an N-type device or a compressive stress for a P-type device.

Figure 13:
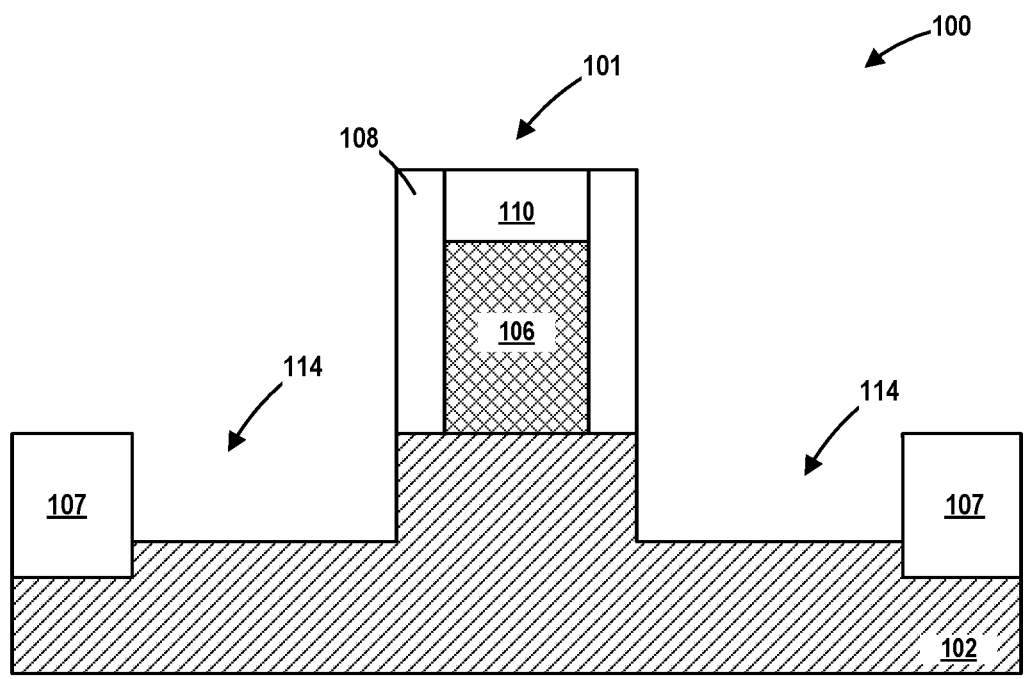
Figure 14:
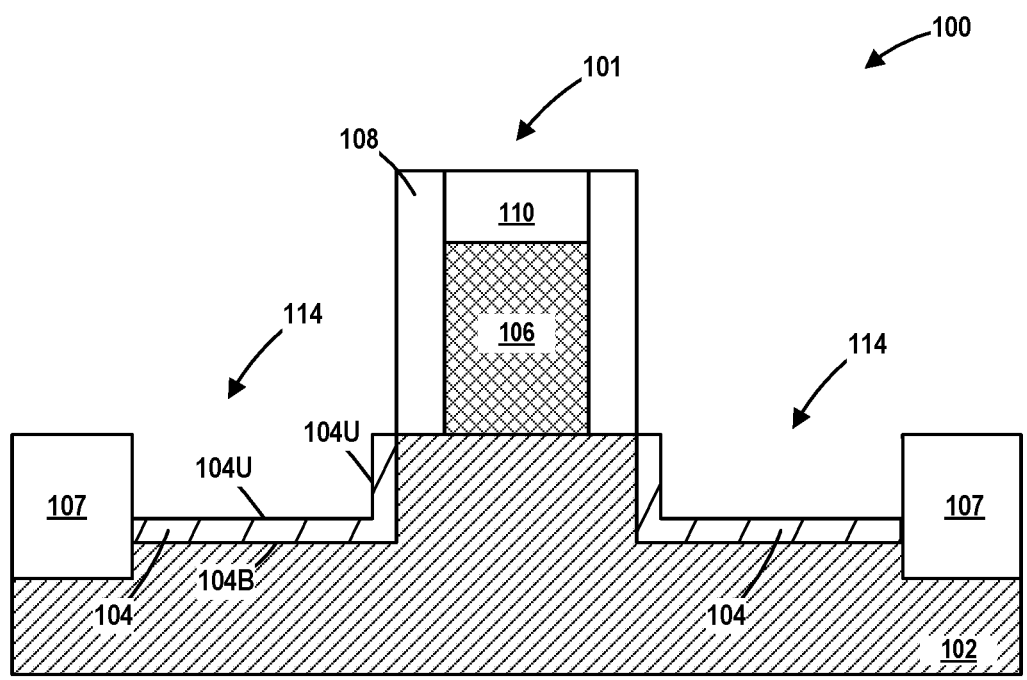

FIGS. 13-16 depict various methods of forming yet another illustrative embodiment of a transistor device 100 disclosed herein with source/drain regions that comprise an interface layer 104. FIGS. 13 and 14 depict the same process flow as described above in connection with FIGS. 4 and 5, respectively.

Figure 15:
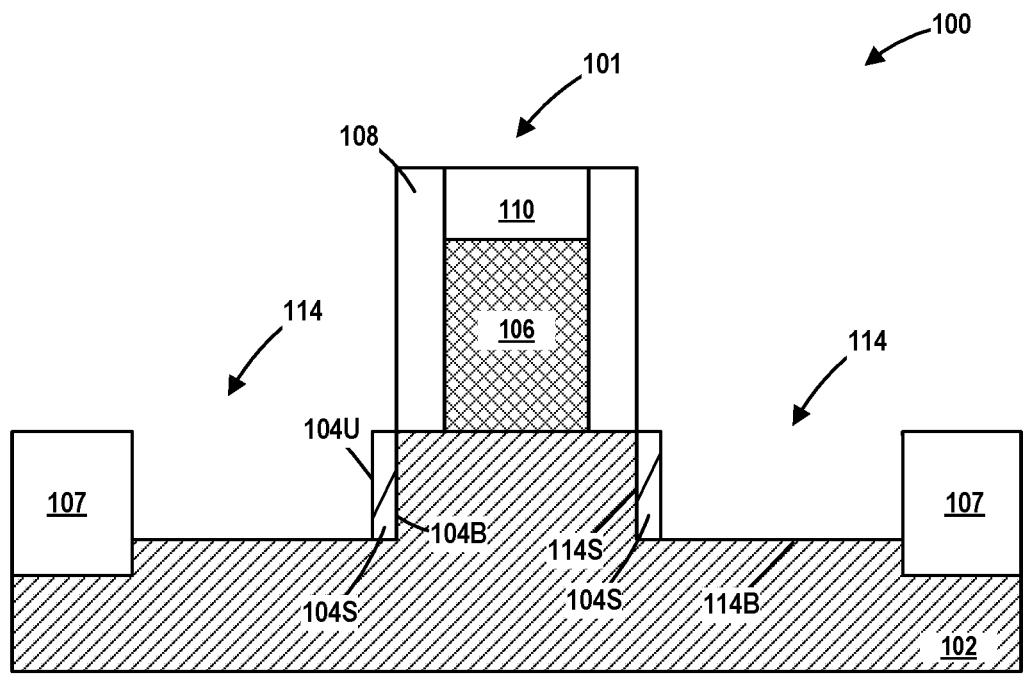

FIG. 15 depicts the transistor device 100 after an anisotropic etching process was performed on the interface layer 104 so as to effectively define a sidewall spacer 104S (comprised of the interface layer 104) that is positioned on the side surface 114S of the epi cavities 114.

Figure 16:
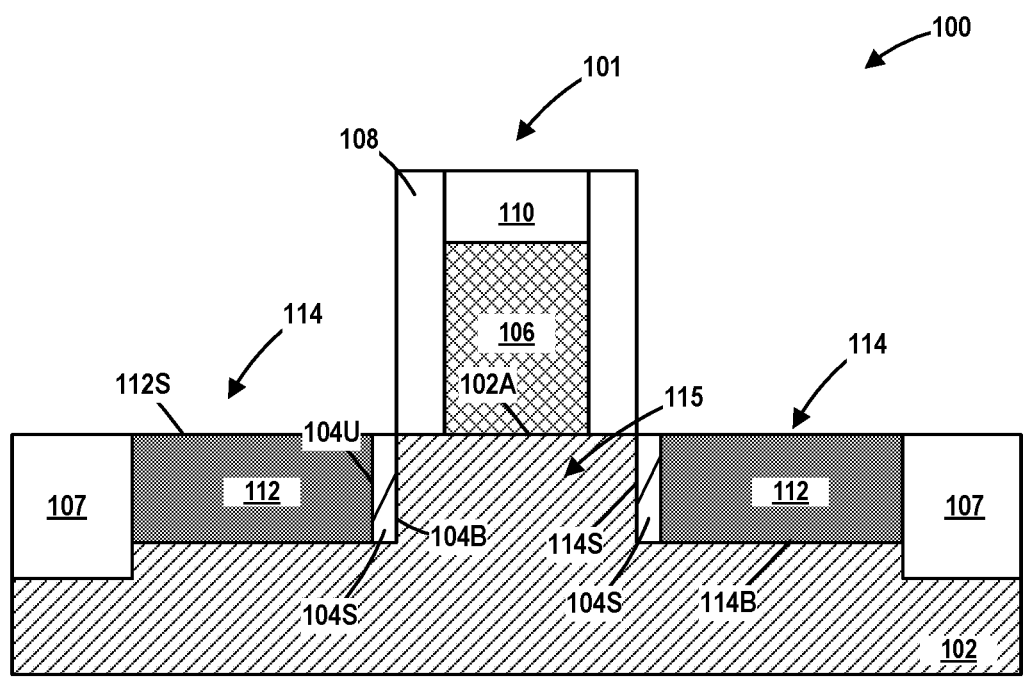

FIG. 16 depicts the transistor device 100 after the above-described epi semiconductor material 112 was grown on the upper surface 104U (which faces sideways in this example) of the spacer 104S (comprised of the interface layer 104) and on the bottom surface 114B of the epi cavities 114. As before, in the example shown in FIG. 16, the epi material 112 is depicted as having an upper surface 112S that is substantially co-planar with the upper surface 102A of the substrate 102. However, as noted above in connection with FIG. 6, in other applications, the upper surface 112S of the epi semiconductor material 112 may be positioned above the level of the upper surface 102A of the substrate 102, and the epi semiconductor material 112 may have a substantially trapezoidal shaped cross-sectional configuration. Of course, as before, the amount or volume of epi semiconductor material 112 that is formed may vary depending upon the particular application.

As will be appreciated by those skilled in the art after a complete reading of the present application, the formation of the spacer 104S (comprised of the interface layer 104) on the side surface 114S of the cavities 114 may act to limit the diffusion of dopant atoms in the epi semiconductor material 112 into the channel region 115 of the transistor device 100, while still allowing dopant atoms in the epi material 112 to more readily diffuse downward through the bottom surface 114B of the epi cavities 114. The inclusion of the spacer 104S (comprised of the interface layer 104) on the side surface 114S of the cavities 114 may also be used to impart desired stress profiles on the channel region 115 of the transistor device 100, i.e., a tensile stress for an N-type device or a compressive stress for a P-type device.

At the point of processing depicted in FIGS. 3, 6, 12 and 16, traditional manufacturing operations may be performed to complete the transistor device 100, the formation of final gate structures by performing known replacement gate processing techniques, the formation of multiple layers of insulating material and various conductive structures that are conductively coupled to the source region, the drain region and the final gate structure of the transistor device. The techniques involved in forming these conductive structures are well known to those skilled in the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor comprising:
   a gate structure positioned above a semiconductor substrate;
   a source region and a drain region;
   an interface layer positioned on and in contact with an uppermost surface of the semiconductor substrate in at least one of the source region and the drain region; and
   an epitaxial semiconductor material positioned on and in contact with an upper surface of the interface layer, wherein a side surface of the epitaxial semiconductor material and a side surface of the interface layer are vertically aligned, and both the epitaxial semiconductor material and the interface layer horizontally abut a sidewall of the gate structure,
   wherein the interface layer further includes:
      one or more sub-monolayers of non-semiconductor material disposed on the uppermost surface of the semiconductor substrate; and
      a layer of semiconductor material positioned on an upper surface of one of the one or more sub-monolayers,
      wherein the non-semiconductor material of the one or more sub-monolayers includes nitrogen, fluorine, carbon, argon or carbon-oxygen.

2. The transistor of claim 1, wherein the semiconductor substrate comprises one of silicon, germanium, silicon-germanium or a III-V material, the epitaxial semiconductor material comprises one of silicon, silicon-germanium, or silicon-carbon.

3. The transistor of claim 1, wherein the transistor device is a planar transistor device.

4. A transistor comprising:
   a gate structure positioned above a semiconductor substrate;
   a source region and a drain region, each of the source region and the drain region comprising a stepped cavity formed in the semiconductor substrate, the stepped cavity comprising an upper cavity and a lower cavity, wherein a bottom surface of the upper cavity intersects a side surface of the lower cavity;
   an interface layer positioned in the lower cavity in each of the source region and the drain region; and
   an epitaxial semiconductor material in each of the source region and the drain region comprising a lower portion in the lower cavity, and an upper portion in the upper cavity, wherein an interface between the upper portion and the semiconductor substrate is free of the interface layer, and wherein the lower portion is positioned on and in contact with an entire side surface and an entire upper surface of the interface layer, and
   wherein one or both of an uppermost surface of the source region and an uppermost surface of the drain region that includes the stepped cavity is coplanar with an uppermost surface of the substrate.

5. The transistor of claim 4, wherein the semiconductor substrate comprises one of silicon, germanium, silicon-germanium or a III-V material, the epitaxial semiconductor material comprises one of silicon, silicon-germanium or silicon-carbon, and the transistor device is a planar transistor device.

6. The transistor of claim 4, wherein the interface layer includes silicon dioxide prepared by depositing one or more atomic layers of oxygen on an upper surface of the semiconductor substrate, and a layer of silicon positioned on an upper surface of one of the one or more atomic layers of oxygen.

7. The transistor of claim 4, wherein the interface layer comprises:
   one or more sub-monolayers of non-semiconductor material disposed on surface of the semiconductor substrate; and
   a layer of semiconductor material positioned on an upper surface of one of the one or more sub-monolayers.

8. The transistor of claim 4, wherein an uppermost surface of the epitaxial semiconductor material is coplanar with the uppermost surface of the semiconductor substrate.

9. The transistor of claim 4, wherein the upper portion of the epitaxial semiconductor material includes a side surface that is aligned with a sidewall spacer of the gate structure.

10. The transistor of claim 9, wherein the side surface of the upper portion of the epitaxial semiconductor material is in contact with the semiconductor substrate.

11. The transistor of claim 4, wherein the upper portion of the epitaxial semiconductor material is positioned between and in contact with both the semiconductor substrate and an isolation structure.

12. The transistor of claim 4, wherein the lower portion of the epitaxial semiconductor material is positioned between and in contact with both the side surface of the interface layer and an isolation structure.

13. The transistor of claim 4, wherein an entire side surface of the epitaxial semiconductor material is in contact with an isolation structure.

14. The transistor of claim 4, wherein the upper portion of the epitaxial semiconductor material is positioned on and in contact with an entire first side surface and an entire the first bottom surface of the upper cavity in each of the source region and the drain region.

15. The transistor of claim 4, wherein an interface between the side surface of the upper portion of the epitaxial semiconductor material and the portion of the semiconductor substrate is free of the interface layer.

16. The transistor of claim 7, wherein the non-semiconductor material of the one or more sub-monolayers includes nitrogen, fluorine, carbon, argon, or carbon-oxygen.

* * * * *